United States Patent
Chang et al.

(10) Patent No.: US 7,998,539 B2
(45) Date of Patent: Aug. 16, 2011

(54) METHOD OF FORMING THIN-FILM STRUCTURE BY OBLIQUE-ANGLE DEPOSITION

(75) Inventors: Chia-Hua Chang, Taipei County (TW);
Chin-Sheng Yang, Taipei (TW);
Ching-Hua Chiu, Taipei (TW);
Pei-Chen Yu, Hsinchu (TW);
Hao-Chung Kuo, Hsinchu (TW)

(73) Assignee: National Chiao Tung University, Hsin Chu (TW)

( * ) Notice: Subject to any disclaimer, the term of this patent is extended or adjusted under 35 U.S.C. 154(b) by 84 days.

(21) Appl. No.: 12/289,816

(22) Filed: Nov. 5, 2008

(65) Prior Publication Data

US 2010/0040859 A1 Feb. 18, 2010

(30) Foreign Application Priority Data

Aug. 14, 2008 (TW) .............................. 97131039 A

(51) Int. Cl.
*C23C 14/30* (2006.01)
(52) U.S. Cl. ........ 427/596; 427/597; 427/165; 427/166; 427/294; 427/376.2
(58) Field of Classification Search .................. 427/595, 427/596, 597, 164, 165, 166, 376.2, 294
See application file for complete search history.

(56) References Cited

U.S. PATENT DOCUMENTS

| | | | |
|---|---|---|---|
| 2005/0025887 A1* | 2/2005 | Xin et al. | 427/255.31 |
| 2005/0045799 A1* | 3/2005 | Deng et al. | 250/200 |
| 2005/0275944 A1* | 12/2005 | Wang et al. | 359/576 |
| 2007/0166539 A1* | 7/2007 | Zhao et al. | 428/375 |
| 2008/0192347 A1* | 8/2008 | Yun et al. | 359/566 |

OTHER PUBLICATIONS

Ye, D-X, et al., "Uniform Si nanostructures grown by oblique angle deposition with substrate swing rotation". Nanotechnology 16 (2005) pp. 1717-1723.*
Wright, Michael, "Recent developments in the production of thin-film magnetic media by electron beam evaporation". J. Vac. Sci. Technol. A 5(1), Jan./Feb. 1987 pp. 57-60.*
Pyun, M.W., et al., "Oblique angle deposition of TiO2 thin films prepared by electron-beam evaporation". Applied Surface Science (2010), doi:10.1016/j.apsusc.2010.08.038, pp. 1-13.*
Wang, Sumei, et al., "ZnS thin films fabricated by electron beam evaporation with glancing angle deposition". 2nd International Symposium on Advanced Optical Manufacturing and Testing Technologies: Advanced Optical Manufacturing Technologies, edited by Proc. of SPIE vol. 6149, 6149L1-5, (2006).*

* cited by examiner

Primary Examiner — Bret Chen

(57) ABSTRACT

A method of forming thin-film structure by oblique-angle deposition is provided. The method includes the steps of: evaporating target source in a chamber by an electron beam evaporation system, and introducing process gas into the chamber and adjusting tilt angle of the evaporation substrate and controlling temperature in the chamber during evaporation to form thin-film on a evaporation substrate by oblique-angle deposition, and then annealing the evaporation substrate to form a thin-film having porous nanorod microstructure.

9 Claims, 7 Drawing Sheets

METHOD OF FORMING THIN-FILM STRUCTURE BY OBLIQUE-ANGLE DEPOSITION

FIELD OF THE INVENTION

The present invention generally pertains to an evaporating method, more particularly, relates to a oblique-angle depositing method to form nanostructured thin-film used as functional electrode of optoelectronic device.

DESCRIPTION OF THE PRIOR ART

Due to the influence of sustainable energy and energy saving policy, solar cell and light-emitting diode have become two major technologies with revolutionary development and prospect in the research of optoelectronic device. Solar cell is used for transducing the light energy directly into electric energy. Light-based energy source not only prevents the contamination issue resulted from the thermal electric generation, but also provides inexhaustible energy supply. In the illuminating application of light-emitting diode (LED), light-emitting diode device has longer lifetime or duration, compact size, and its luminous efficiency is far higher than the conventional bulb illumination. Therefore LED is quite adaptive to the energy saving tendency in $21^{st}$ century.

In the research of two major optoelectronic technologies, the manufacture of device and the material development are always the bottleneck and the research direction for the industry. As far as the manufacture of solar cell device is concerned, if we want to increase the light-receiving surface of the device, the area of metal surface electrodes is inevitably reduced. The decrease of metal electrode number will reduce the amount of collected photocurrent. On the other hand, if we want to collect more photocurrent, the disposition area of metal electrode is necessarily expanded, this approach also shrinks the light-receiving surface. This problem also occurs in the application of light-emitting diode. Accordingly, the tradeoff relation between light-receiving surface and metal electrode area limits the conversion efficiency of optoelectronic device.

In the manufacture of optoelectronic device, a transparent conductive oxides (TCO) is coated on the device surface to increase the capability of collecting photo charges or current spreading. Conventional TCO film is provided with transmissivity of 80%~90%. In order to increase the transmissivity of optoelectronic device and achieve better device efficiency, additional processes are introduced in the manufacturing, such as the antireflection coating.

The manufacture of antireflection layer and device electrode is two different processes. Traditionally, TCO film is coated by sputtering or depositing, and the antireflection layer is growth by depositing. Recently, several researches in connection with the growth of nanostructured antireflection film are proposed in academy, but the complicated process is still the bottleneck to overcome. Furthermore, TCO film is always the necessary layer to optimize and integrate the overall optoelectronic property, which increase the additional cost. If antireflection layer has electric conductivity, it can further increase the conversion efficiency of the optoelectronic device, or totally replace the electrode.

The prior research investigates the antireflection layer with graded refractive index and their broadband antireflection characteristics in air ambient. For the antireflection layer of optoelectronic device, the reflectivity in the interface is usually changed with the wavelength of incident light. The incident surface only allows the incident light with certain wavelength spectrum to pass, thus the actual light quantity entering into device is significant reduced. In addition, the incident angle is also a critical factor for the reflectivity change. Research shows that the reflectivity will boost when the light incident angle greater than a specific value, but it also simultaneously decrease the light transmissivity, causing the degradation of conversion efficiency in optoelectronic device. Fresnel reflection law shows that the light will have more possibility to be reflected if the difference between two refractive indices is larger when light passes through two different mediums, and devices will loss more energy when more light is reflected. For this reason, the film material must have the refractive index which is very close to the air refractive index of 1 when operating in the air ambient. There is no solid material with refractive index between 1~1.4 in the nature. Though some artificial porous material can reach this requirement, their film thicknesses are not thin enough to use as the optical film. Refractive index not only influence the amount of light refracted, but also influence the property of light reflection and diffraction. In general, the depositing is often used to form high-quality thin-film with low refractive index (i.e. close to 1). A thin-film with omni-directional, broadband characteristic is highly desirable to eliminate the Fresnel reflection. Recently, Many approaches of forming thin-film with graded-index profile are proposed, especially those used in the air ambient, including chemical etch-leaching process on glass surface, recently reported sol-gel process, interference-patterning by two coherent light beams, and so on. However, Most of these methods don't have good control over the graded-index profile, and some method even take more complicated process to realize. A letter in journal of nature photonics (Vol. 1, March 2007) discloses a optical film material with broadband, low refractive index to eliminate the Fresnel reflection. The graded-index profile is achieved in this research by forming multilayer coating with different composition, such as $SiO_2$ and $TiO_2$. Multilayer structure implies that multiple processes are required, and their manufacturing cost is higher.

On the other hand, a good transparent electrode must be provided with excellent transmissivity and low resistivity to enhance external quantum efficiency and conversion efficiency, as well as restrain the heat production. Transparent electrode with large disposition area and low resistivity has better current spreading effect, it's luminescence efficiency may further increase.

Accordingly, efficient control over the distribution of graded refractive index in optical film is very important for making high-quality thin-film with broadband, low resistivity, high transmissivity characteristics, which is high desired in many application.

SUMMARY OF THE INVENTION

The present invention discloses a method of forming nanostructured thin-film of transparent conductive oxide by oblique-angle deposition. The electron-beam oblique-angle deposition technology is used in embodiment of present invention; a proper amount of oxygen and nitrogen are introduced during the process, following a thermal annealing to form thin-film on Si substrate and glass substrate. Nanostructured film has broadband characteristics span from visible spectrum to near infra-red spectrum, as well as the high transmissivity, and excellent electric conductivity to enhance the charge collection and current spreading. This process may be widely used in the manufacture of transparent electrode in semiconductor device, such as solar cell, light-emitting diode, to increase their conversion efficiency.

In one embodiment of present invention, the electron-beam vapor deposition (i.e. evaporation) is utilized to form electric conductive thin-film with porous and nanorod structure used as functional electrode. The electron-beam evaporating system in present invention is provided with at least one sample stage which can adjust its tilt angle, a target material is used as the evaporation source of transparent conductive oxide, and a upper electrode evaporating substrate. Besides, the temperature and vacuum pressure are controlled during the process. The apparatus described herein is a conventional skill, no more unnecessary detail will be provided in the following description. In the deposition process, functional electrode with porous or pillar structure is formed by adjusting the gas flow introduced, chamber temperature, and angle of deposition substrate, and a following thermal annealing process is performed to achieve better optoelectronic property.

In another embodiment of present invention, a method of forming porous and pillar conductive thin-film is provided by electron beam evaporation. In the embodiment, the deposition temperature is controlled between 100° C. to 450° C., and the vacuum pressure is maintain during the process. The deposition source includes Indium Tin Oxide (ITO), aluminum zinc oxide (AZO), ZnO, and other material capable of forming transparent conductive thin-film. The substrate used as upper deposition substrate includes: Si substrate, GaAs substrate, glass substrate, flexible substrate, etc. The sample stage can change its tilt angle between 0°~90°, wherein the angle ranging between 50°~90° is preferred. The process gas includes oxygen, nitrogen, or the combination thereof, wherein the gas flow is controlled at 0 sccm to 50 sccm (standard cubic centimeters per minute), and the chamber pressure is controlled between $10^{-3}$ torr to $10^{-6}$ torr. The following thermal annealing process lasts 1~60 min, the temperature is maintain around 200° C. to 900° C. Oxygen is also introduced during the annealing process.

One aspect of present invention is to provide a nanostructured conductive thin-film with broadband, high transmissivity, low reflectivity, as well as low sheet resistance, to increase the amount of light received and provide excellent conductive auxiliary electrode characteristic. The nanostructured thin-film has larger light divergence angle to enhance current spreading, which is quite adaptive in the optoelectronic device such as light-emitting diode, and solar cell.

Another aspect of present invention is to provide a method of forming nanostructured thin-film. The electron bean oblique angle deposition is utilized in present invention to form pillar microstructure in nanometer scale.

The forgoing forms and other forms, objects, and aspects as well as features and advantages of the present invention will become further apparent from the following detailed description of the presently preferred embodiments, read in conjunction with the accompanying drawings. The detailed description and drawings are merely illustrative of the present invention rather than limiting the scope of the present invention being defined by the appended claims and equivalents thereof.

BRIEF DESCRIPTION OF THE DRAWINGS

FIG. 3b is the SEM image of nanorod structure of FIG. 3a;

FIG. 3c is the cross-section view of nanorod structure of FIG. 3a;

DESCRIPTION OF THE PREFERRED EMBODIMENT

The invention will now be described in greater detail with preferred embodiments of the invention and illustrations attached. Nevertheless, it should be recognized that the preferred embodiments of the invention is only for illustrating. Besides the preferred embodiment mentioned here, present invention can be practiced in a wide range of other embodiments besides those explicitly described, and the scope of the present invention is expressly not limited expect as specified in the accompanying Claims.

Figure 1A:
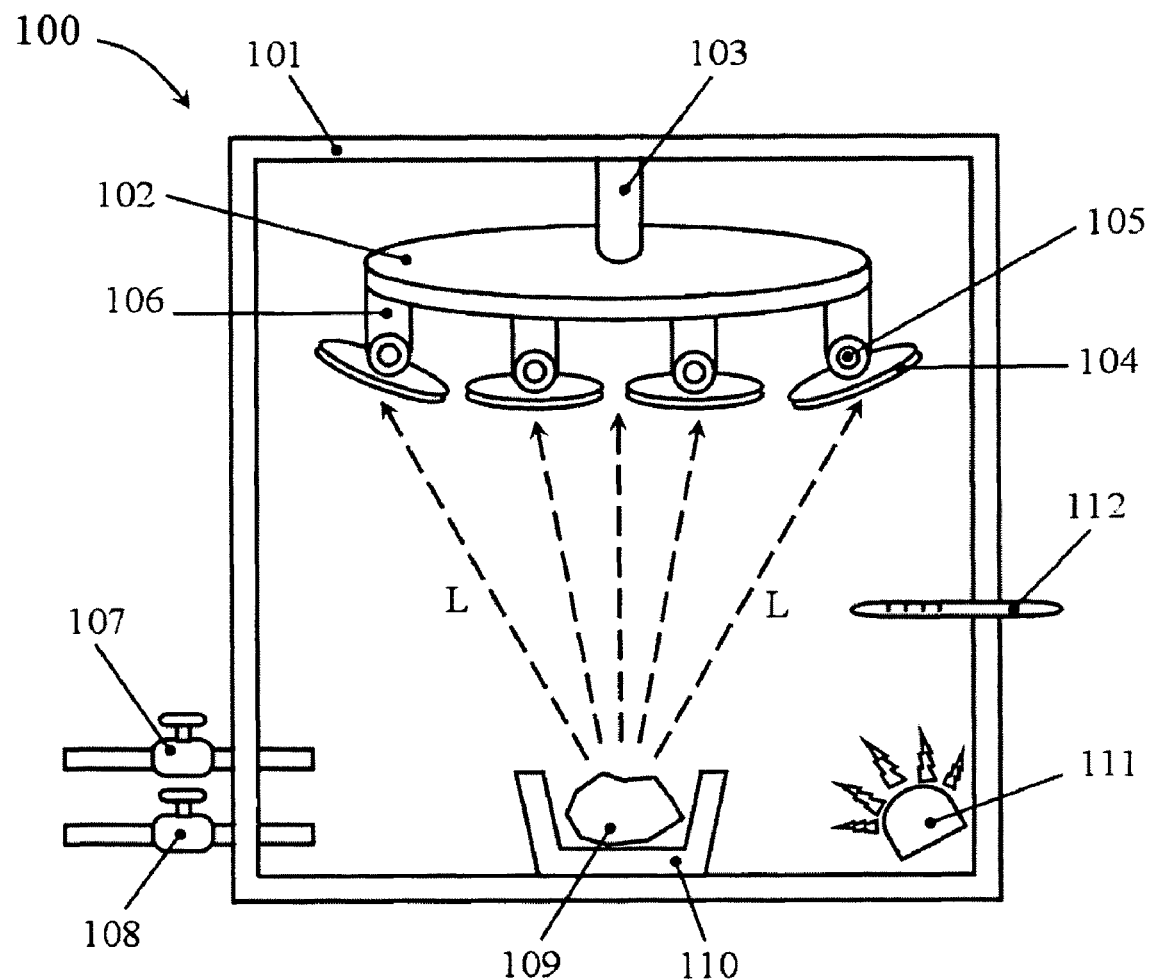
FIG. 1a illustrates the electron beam evaporation system by oblique angle deposition to form transparent electrode film in accordance with one embodiment of the present invention.

Referring now to FIG. 1a, it illustrates an electron bean evaporating system 100 by oblique angle deposition to form transparent electrode film in accordance with one embodiment of the present invention. The system comprises: an external chamber 101 to receive the components in electron bean evaporating system 100 and define a process space. The pressure and temperature inside the chamber are stably controlled to provide good process quality. A central disc 102 disposed on the surface center inside the chamber with a plurality of cantilever hanged therearound; A supporting shaft 103 is connected on the center of central disc 102 and can axially rotate with the central disc 102 to achieve better process uniformity. Each cantilever 106 is provided with a rotating part 105 on the lower end to connect with a sample stage 104. The evaporation substrate (114 in FIG. 1b) can be fixed on sample stage 104, and rotating part 105 is used to adjust the oblique angle of sample stage 104. The oblique angle of sample stage 104 directly changes the incident angle of evaporating particle to the substrate, thus the property of final product is changed. A crucible 110 is disposed right below the central disc 102 for placing the target source to be evaporated; Crucible 110 is made of high temperature material that would not react with the target source placed therein during the process. A plurality of gas control valve (ex. valve 107 and 108) is disposed in the chamber 101 to control the flow of various process gases. Furthermore, a heat source 111 is disposed to control and maintain the process temperature. A thermo couple 112 may also be optionally disposed in the chamber 101 to measure the temperature. The dash line L in FIG. 1a shows the directions of evaporating particles incident to evaporation substrates, the detail will be described in following embodiment in FIG. 1b.

Figure 1B:
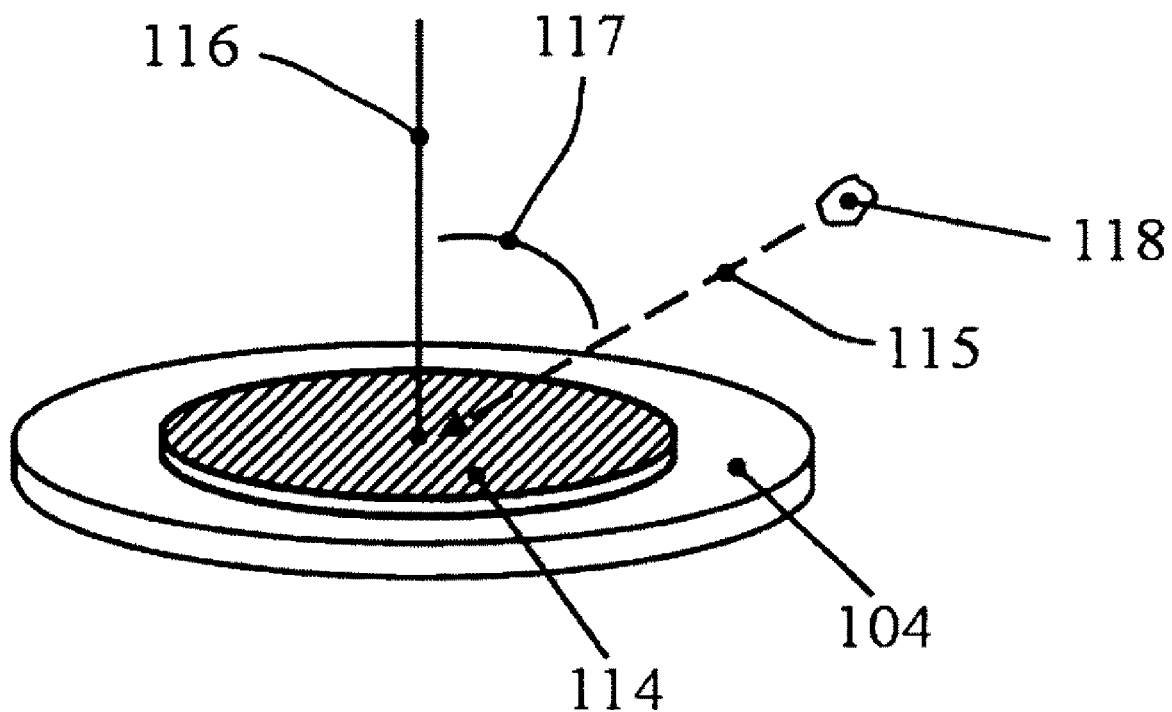
FIG. 1b illustrates schematic view of the evaporation substrate disposed on the incident sample stage in accordance with one embodiment of the present invention.

Referring now to FIG. 1b, which illustrates the schematic view of evaporation substrate 114 placed on the sample stage 104. The oblique angle deposition apparatus in present invention comprises a electron beam evaporation system 100 to evaporate the target source; Gas control valves 107 and 108 are disposed in the chamber to control the gas flow; A heat source 111 is used to maintain the temperature; Angle controlling device, i.e. rotating part 105 in FIG. 1, is used to control the tilt angle of substrate in oblique deposition process. As illustrated in FIG. 1*b*, the incident angle is defined by the included angle 117 between the incident direction 115 of target particle 118 and the normal direction of deposition substrate 114. The incident angle of target particle has significant influence on the physical property of thin-film.

Figure 2:
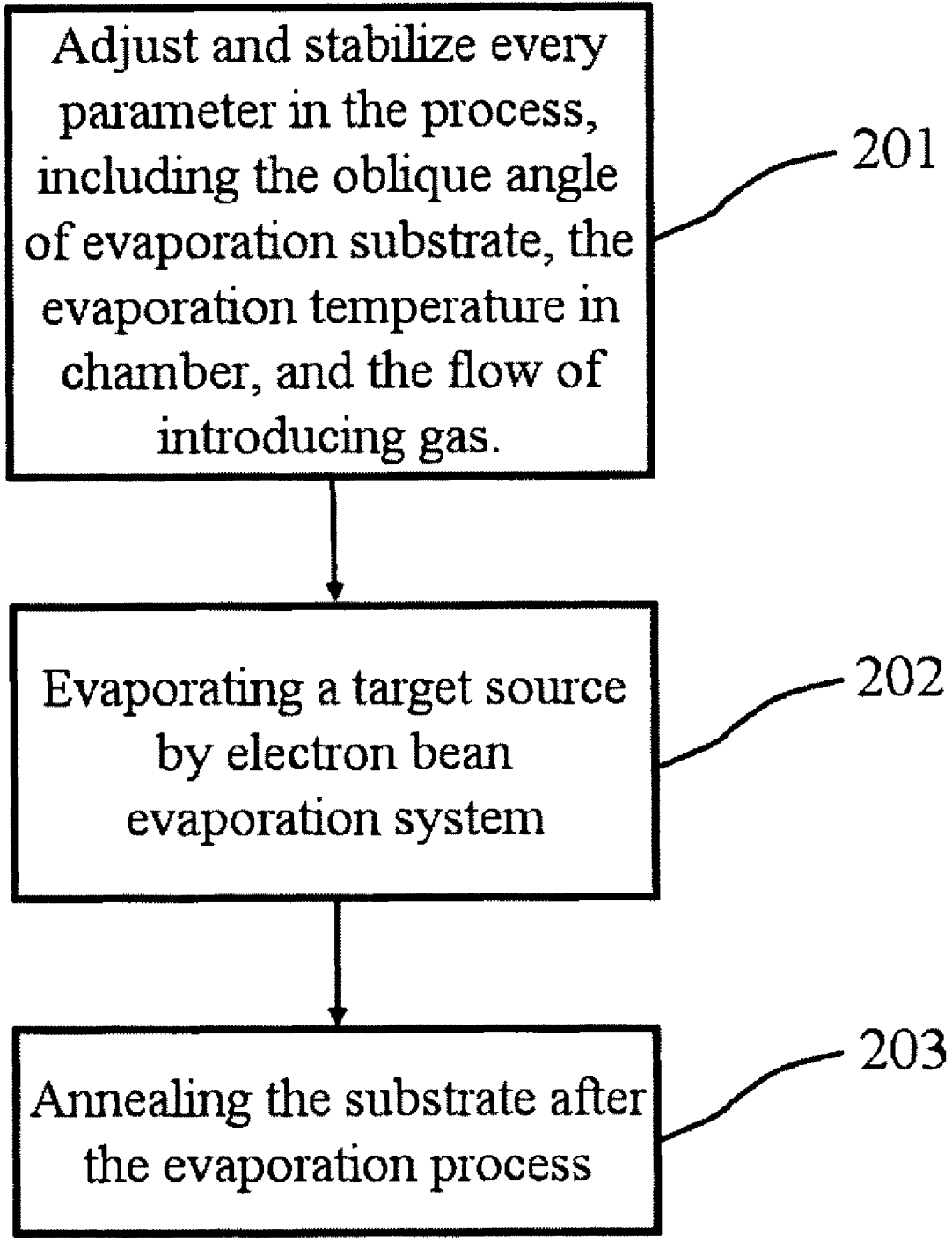
FIG. 2 illustrates the flowchart of forming nanostructure conductive thin-film by electron bean oblique angle deposition in accordance with one embodiment of the present invention.

In another embodiment of present invention, a method of forming electric conductive thin-film with porous and nanorod structure by electron bean oblique angle deposition is disclosed. An electron bean evaporation system with adjustable sample stage is used to achieve the oblique deposition effect. As showed in FIG. 2, the step comprises: 1. adjust and stabilize every parameter in the process (201), such as the oblique angle of evaporation substrate, the evaporation temperature in chamber, the flow of introducing gas. For example, the oblique angle in the process is between 0°~90°, where in the angle of 50°~90° is preferred; 2. After all parameter in the process are stabilized, using electron beam evaporation system to deposit the target material on the substrate (202). High electric potential is applied in this step to accelerate the electron and a magnetic field is established to control the electron trajectory. The accelerated electron will collide with target material (i.e. evaporation source), producing heat energy for target material to be evaporated into gas. The target as will apply on the substrate in the high-vacuum environment, as the evaporation substrate 114 in the embodiment of present invention. The target material or evaporation source used in present invention includes Indium Tin Oxide (ITO), aluminum zinc oxide (AZO), ZnO, and other material capable of forming transparent conductive thin-film. The evaporation substrate in present invention includes Si substrate, GaAs substrate, glass substrate, flexible substrate, etc. During the process, evaporation substrate will be adjusted to particular angle, the included angle between normal direction of substrate and incident direction of target particle is controlled within 0°~90° to obtain the desired surface transparent electrode structure, wherein the angle of 50°~90° is preferred, as showed in the included angle 117 in FIG. 1*b*. Generally, the gas type and flow both influence the electrical property and optical property of the thin-film to be deposited if process gas is introduced during the evaporation, such as nitrogen, oxygen, or acetylene. In the embodiment of present invention, the chamber is introduced with oxygen, nitrogen, or the combination thereof during the evaporation process. The gas flow is configured between 0 sccm to 50 sccm. The evaporation system simultaneously maintains the chamber pressure between $10^{-3}$ torr to $10^{-6}$ torr to achieve desired electrical and optical property. The result will be described in the following embodiment. Before evaporation process, the process chamber will be preheated to process temperature. In the embodiment of present invention, the temperature in electron beam evaporation system is configured at about 100° C. to 450° C. When deposition finished, a transparent conductive thin-film is formed on the evaporation substrate. To obtain the desired thin-film electrode structure, a thermal annealing process is applied after the evaporation (203). The oxygen is introduced during the annealing process, and the temperature is configured at 200° C. to 900° C., the process duration is about 1~60 minutes; The thermal annealing process in present invention may further increase the transmissivity of thin-film microstructure and lower their resistivity.

Figure 3A:
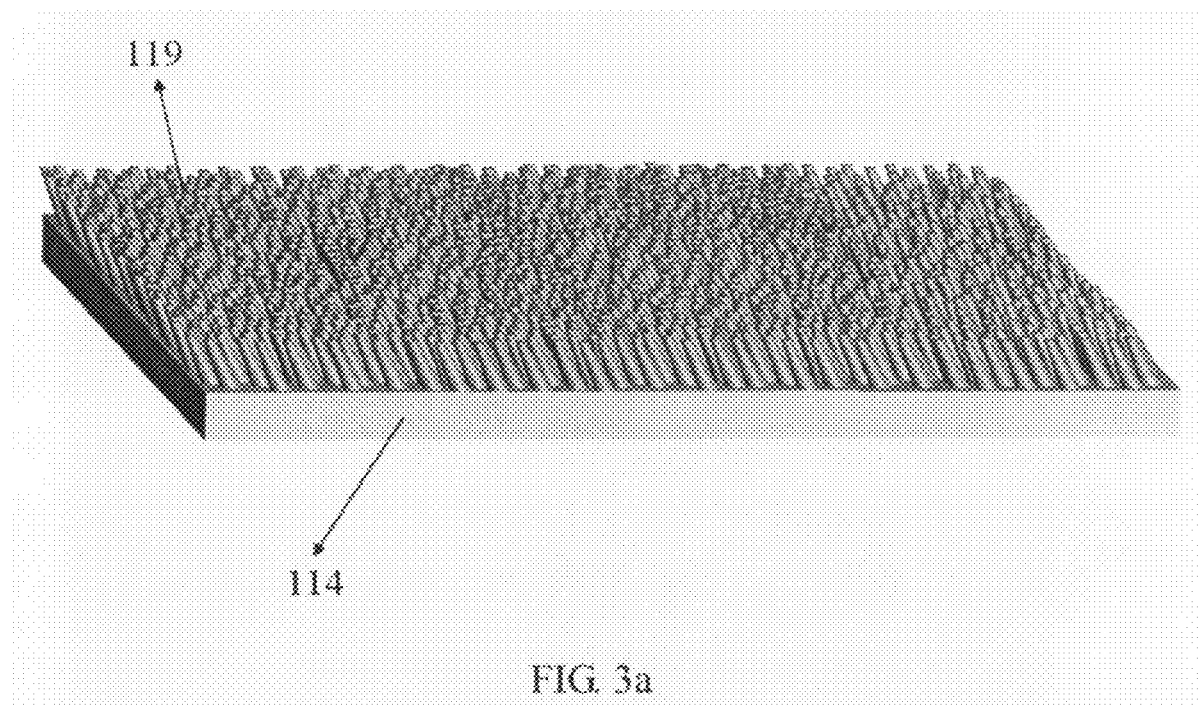
FIG. 3a illustrates a schematic view of film microstructure formed by oblique angle deposition in FIG. 2 in accordance with one embodiment of the present invention.
Figure 3B:
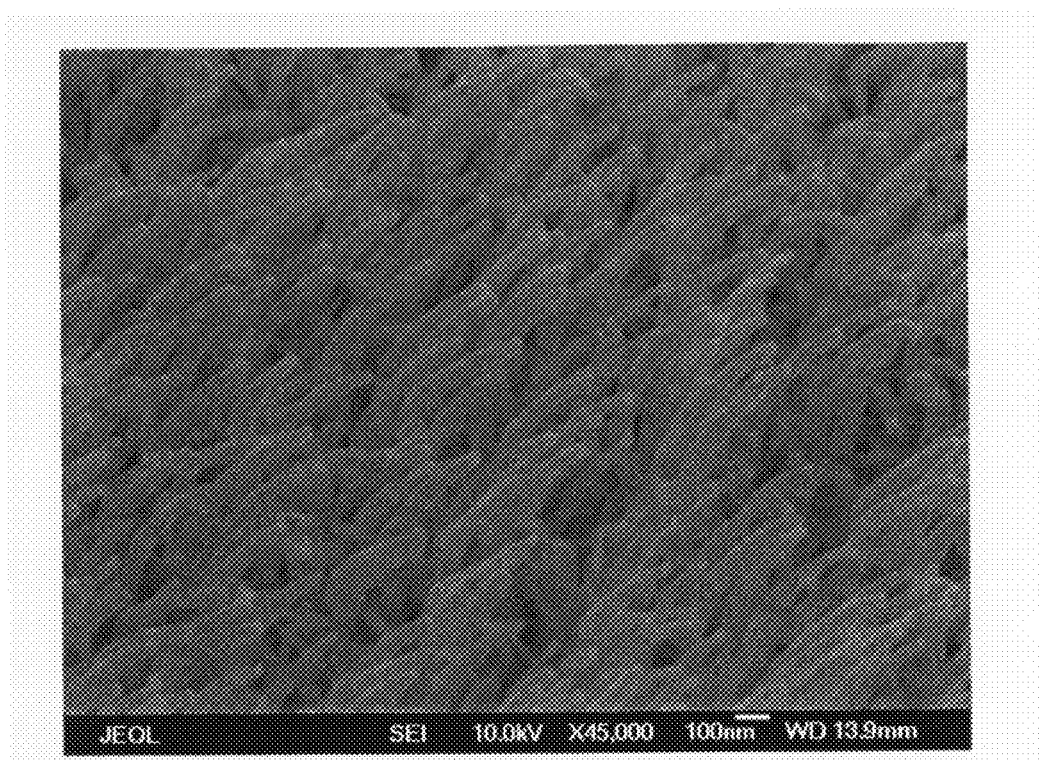
Figure 3C:
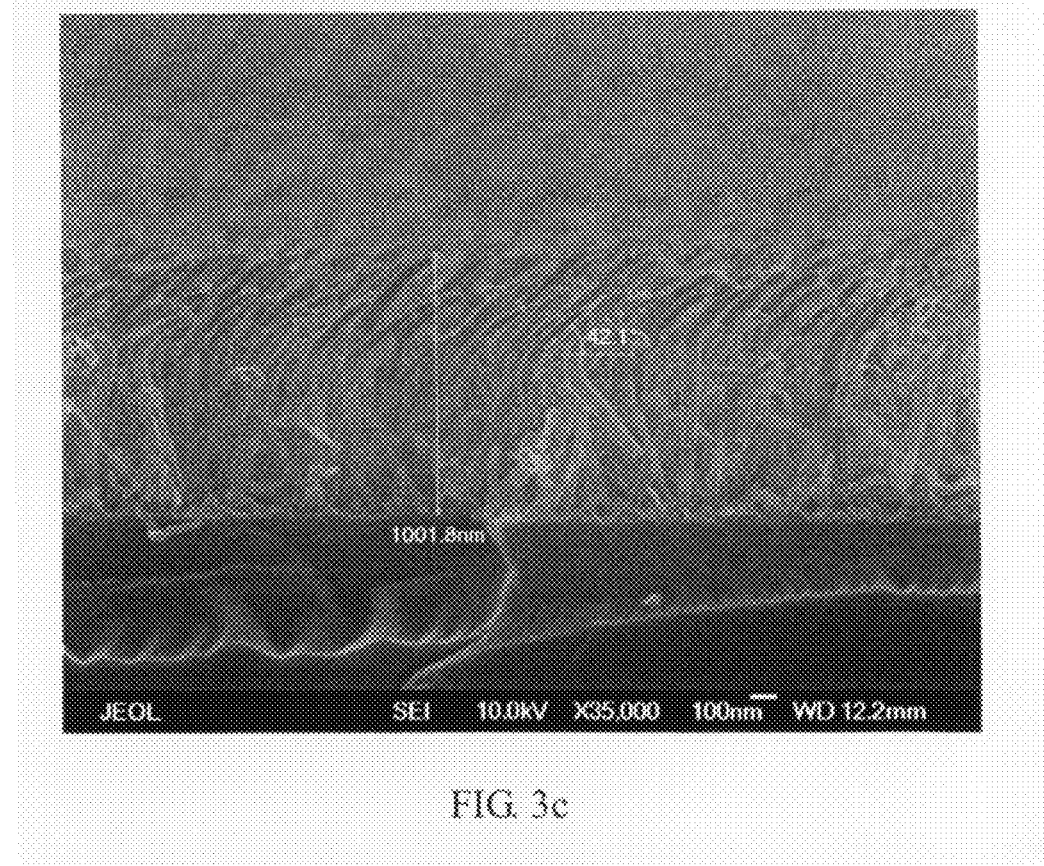

Referring now to FIG. 3*a*, it illustrates the schematic view of thin-film microstructure by oblique angle deposition. As showed in figure, the thin-film grown by above-mentioned method has nanorod structure 119, which is distributed uniformly on the evaporation substrate 114. FIG. 3*b* and FIG. 3*c* illustrates the SEM top image and cross-section image of the nanorod structure 119, respectively. The nanorod structure 119 is the aggregation of tread-like pillar, similar to the fiber in the cloth. The nanorod structure is tightly distributed on evaporation substrate to form compact, porous thin-film microstructure. Further, as showed in FIG. 3*a*, the nanorod in present embodiment has narrow end. The level closer to evaporation substrate has higher film density, and the level near film surface has lower density. This kind of structure can achieve the graded refractive index effect in one single layer. On the other hand, the approach in prior art is by performing multiple evaporation process on a single substrate to form multi-layer thin-film structure, wherein the target material of respective layer may be different. Comparatively, the advantage of present invention is to achieve the graded refractive index effect in one single layer by tuning the parameter of evaporation process. Thus the required process material and cost is reduced, and the excellent electrical property of transparent thin-film electrode is achieved.

Figure 4:
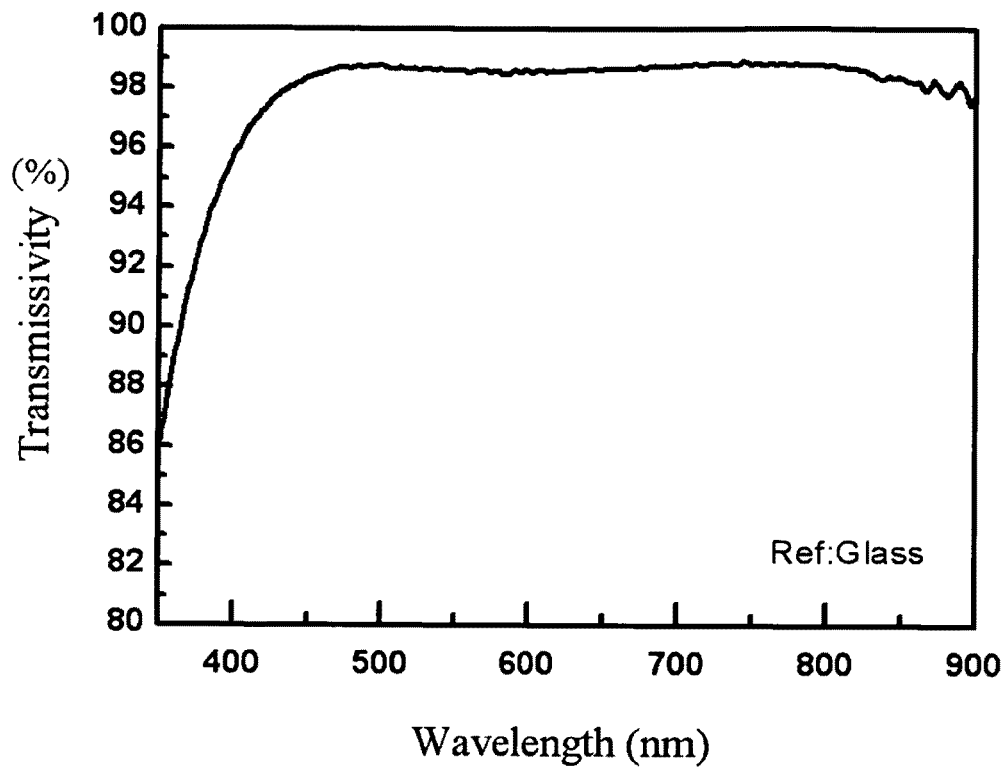
FIG. 4 illustrates the wavelength distribution of nanorod structure applied on glass substrate in accordance with one embodiment of the present invention.
Figure 5:
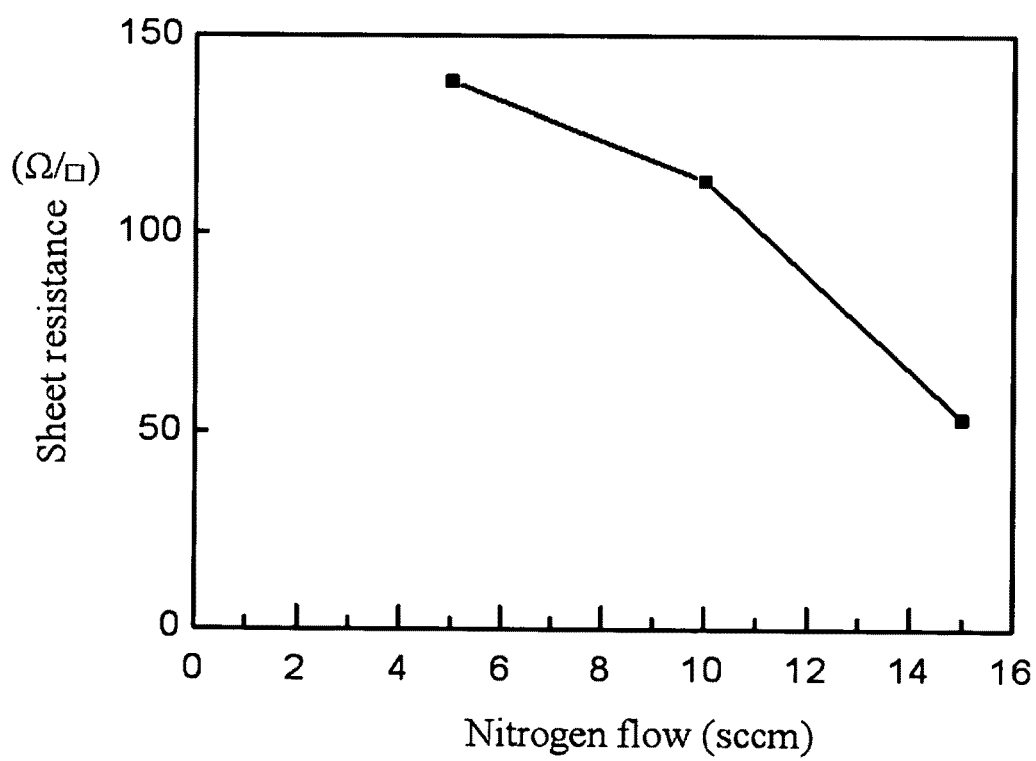
FIG. 5 illustrates the sheet resistance distribution of nanorod structure applied on glass substrate in accordance with one embodiment of the present invention.
Figure 6:
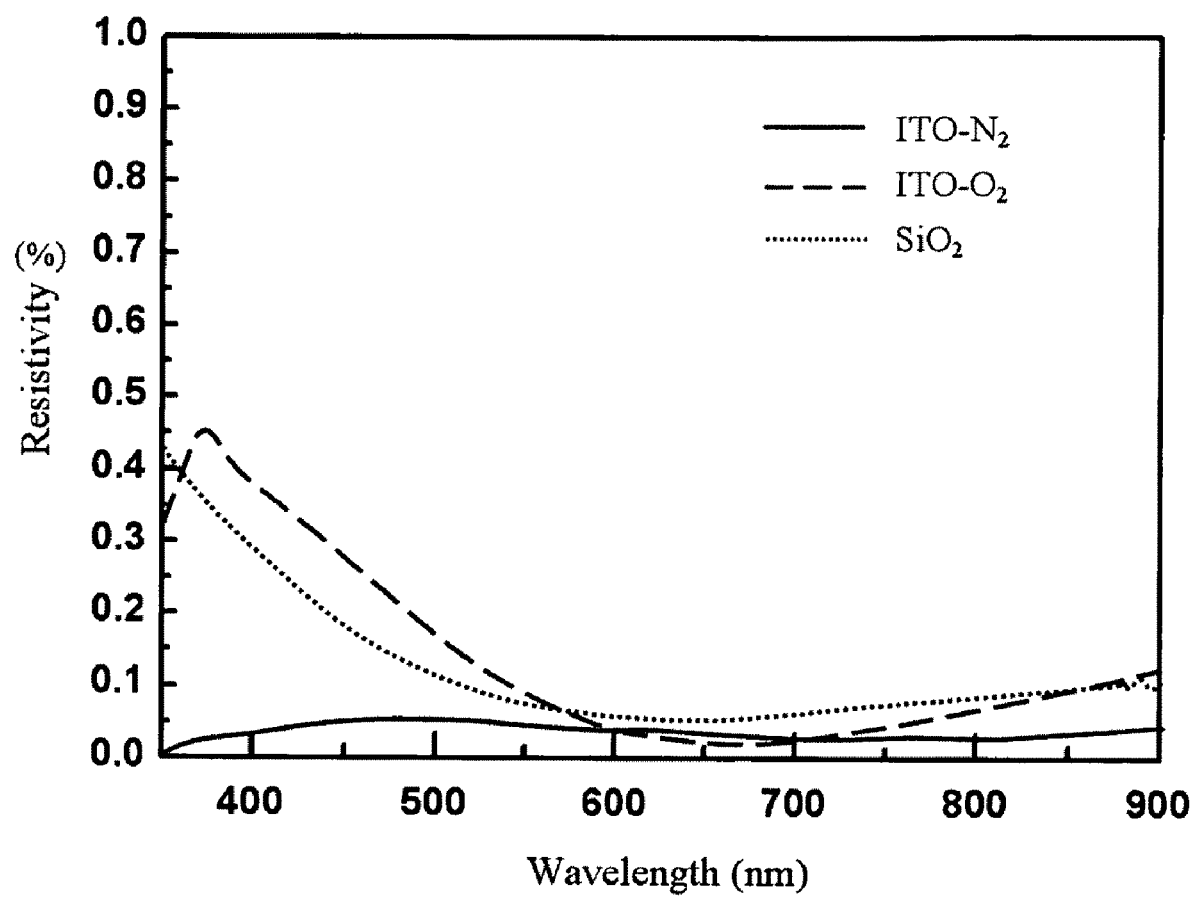
FIG. 6 illustrates the reflectivity distribution of nanorod structure in accordance with one embodiment of the present invention.

The nanostructure thin-film formed by the method of present invention is provided with excellent transparent electrode property. FIG. 4 shows the transmissivity distribution of nanostructure thin-film applied on glass substrate. As shows in the figure, the transparent thin-film electrode formed in present invention has the transmissivity up to 98% under incident light with wavelength ranging from 450 nm to 800 nm, showing the effective wavelength of thin-film in present invention spans from visible spectrum to near infra red spectrum. In the application of transparent electrode in optoelectronic device, high transmissivity means more incident light is received. Because a single incident light has specific wavelength range except of a wavelength value, the transparent electrode with broadband characteristic substantially receives more incident light. Further, as showed in FIG. 5, the sheet resistance of transparent electrode in present invention is change with the flow of introducing gas. As far as the application of LED is concerned, the rising resistance between transparent electrode and substrate not only degrade the device's conversion efficiency, but also produce unnecessary heat that lowers the lifetime of device. In the embodiment of present invention, the sheet resistance may lower to 50Ω/□ by introducing more nitrogen, the transparent electrode has good current spreading and excellent electric conductivity. In the application of Si substrate, FIG. 6 shows the reflectivity distribution of transparent electrode structure in present invention. As showed in the figure, the reflectivity distribution is dependent on the used target source (ex. ITO or $SiO_2$) and introduced gas type ($N_2$ or $O_2$). For nanorod thin-film formed in present invention, the incident light with wavelength ranging from 550 nm to 800 nm has reflectivity performance below 10%. With lower reflectivity, the energy loss of incident light is fewer, thus the electric efficiency of solar cell is significantly improved.

Accordingly, the method of present invention can form nanostructure conductive thin-film with the characteristic like broadband, high transmissivity (over 98%), low reflectivity (under 10%), and low sheet resistance (50Ω/□), to increase the amount of received light and provides excellent light absorption for electric conductive auxiliary electrode, which is adaptive in the application of surface thin-film electrode on solar cell. Furthermore, the thin-film formed by nanorod structure has the surface roughness to some extent for expanding the light divergence angle as well as enhancing the current spreading. Therefore, the present invention can improve the optoelectronic property of LED device.

While the embodiments of the present invention disclosed herein are presently considered to be preferred embodiments, various changes and modifications can be made without departing from the spirit and scope of the present invention. The scope of the invention is indicated in the appended claims, and all changes that come within the meaning and range of equivalents are intended to be embraced therein.

What is claimed is:

1. A method of forming thin-film structure by oblique-angle deposition, comprising the step of:
   evaporating target source in a chamber by an electron beam evaporation system;
   introducing process gas into said chamber and adjusting tilt angle of said evaporation substrate to form thin-film on a evaporation substrate by oblique-angle deposition, process temperature within said chamber is controlled during evaporation; and
   annealing said evaporation substrate to form a thin-film having porous nanorod microstructure with increased amount of received light, improved light divergence angle, and enhanced current spreading;
   wherein said target source is metal oxide, and end of each nanorod is thinner than root of each nanorod for providing graded refractive index and high transmissivity.

2. The method of claim 1, wherein said metal oxide comprises indium tin oxide (ITO), aluminum zinc oxide (AZO), or ZnO.

3. The method of claim 1, wherein said evaporation substrate comprises Si substrate, GaAs substrate, glass substrate, or flexible substrate.

4. The method of claim 1, wherein said introduced process gas comprises oxygen, nitrogen, and the combination thereof.

5. The method of claim 4, wherein the flow of said introduced process gas is between 0 sccm to 50 sccm (standard cubic centimeters per minute).

6. The method of claim 1, wherein the included angle between the incident direction of said target source particle and the normal direction of said evaporation substrate is between 0° to 90°.

7. The method of claim 1, wherein the process temperature within said chamber is controlled between 100° C. to 450° C.

8. The method of claim 1, wherein said annealing holds for about 1 min to 60 min.

9. The method of claim 1, wherein the pressure within said chamber is controlled between 10-3 torr to 10-6 torr.

* * * * *